United States Patent
Wakii et al.

(10) Patent No.: US 9,502,979 B2
(45) Date of Patent: Nov. 22, 2016

(54) OUTPUT SWITCHING CIRCUIT

(71) Applicant: Spansion LLC, Sunnyvale, CA (US)

(72) Inventors: Takeshi Wakii, Yokohama (JP);
Akihito Yoshioka, Yokahama (JP)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 6 days.

(21) Appl. No.: 14/598,647

(22) Filed: Jan. 16, 2015

(65) Prior Publication Data

US 2015/0130430 A1    May 14, 2015

Related U.S. Application Data

(63) Continuation of application No. 13/117,717, filed on May 27, 2011, now Pat. No. 8,957,648.

(30) Foreign Application Priority Data

Aug. 31, 2010   (JP) .................. 2010-193164

(51) Int. Cl.
*G01F 1/40* (2006.01)
*H02M 3/158* (2006.01)
*H03K 17/687* (2006.01)

(52) U.S. Cl.
CPC ........... *H02M 3/158* (2013.01); *H02M 3/1588* (2013.01); *H03K 17/6872* (2013.01); *Y02B 70/1466* (2013.01)

(58) Field of Classification Search
CPC . H02M 3/1584; H02M 3/158; H03F 1/3217; H02F 1/34
USPC ....... 323/207, 222, 224, 271, 272, 282–289; 363/89, 97, 98
See application file for complete search history.

(56) References Cited

U.S. PATENT DOCUMENTS

| | | | |
|---|---|---|---|
| 4,292,581 A | 9/1981 | Tan | |
| 5,373,435 A | 12/1994 | Jayaraman et al. | |
| 6,259,613 B1 * | 7/2001 | Lee | G05F 1/70 323/222 |
| 6,362,683 B1 | 3/2002 | Miao et al. | |
| 6,747,441 B2 | 6/2004 | Johnson et al. | |
| 6,930,526 B1 * | 8/2005 | Silva | H02M 3/156 323/274 |

(Continued)

FOREIGN PATENT DOCUMENTS

| CN | 1618168 A | 5/2005 |
|---|---|---|
| CN | 1956306 A | 5/2007 |

(Continued)

OTHER PUBLICATIONS

English language abstract of Japanese patent publication No. 56-39606 A.

(Continued)

*Primary Examiner* — Rajnikant Patel

(57) ABSTRACT

An output switching circuit includes a switching circuit having a first transistor connected to a high-voltage power supply, a second transistor connected to a low-voltage power supply, and an output s terminal at a connection node between the first and second transistors; a comparison unit that compares an input signal with a feedback signal obtained by feedback of an output signal of the output terminal via a low-pass filter to generate a comparison signal; and a drive pulse generating unit that generates first drive pulses for driving the first transistor and second drive pulses for driving the second transistor in accordance with the comparison signal.

20 Claims, 14 Drawing Sheets

(56) References Cited

U.S. PATENT DOCUMENTS

| | | | |
|---|---|---|---|
| 6,952,131 B2 | 10/2005 | Jeong et al. | |
| 7,113,038 B2 | 9/2006 | Putzeys | |
| 7,230,406 B2* | 6/2007 | Huang | H02M 3/1584 323/222 |
| 7,279,870 B2 | 10/2007 | Hasegawa et al. | |
| 7,339,360 B2 | 3/2008 | Chen et al. | |
| 7,453,287 B2* | 11/2008 | Umeki | H02M 1/36 326/33 |
| 7,551,007 B2 | 6/2009 | Khasiev et al. | |
| 7,696,738 B2 | 4/2010 | Kasai et al. | |
| 7,701,181 B2 | 4/2010 | Inoue | |
| 7,863,934 B2* | 1/2011 | Lin | H03K 19/01 326/82 |
| 8,077,490 B1 | 12/2011 | Prodic et al. | |
| 2005/0012546 A1 | 1/2005 | Jeong et al. | |
| 2009/0189578 A1 | 7/2009 | Chen et al. | |
| 2012/0049811 A1 | 3/2012 | Wakii et al. | |

FOREIGN PATENT DOCUMENTS

| | | |
|---|---|---|
| CN | 201039034 Y | 3/2008 |
| CN | 101741325 A | 6/2010 |
| JP | 56-39606 A | 4/1981 |
| JP | 2005-517337 A | 6/2005 |
| JP | 2005-523631 A | 8/2005 |
| JP | 2007-067554 A | 3/2007 |

OTHER PUBLICATIONS

English-language Abstract for Chinese Patent Publication No. 201039034 Y, published Mar. 19, 2008; 1 page.

English-language Abstract for Chinese Patent Publication No. 101741325 Y, published Jun. 16, 2010; 1 page.

English-language Abstract for Japanese Patent Publication No. 2007-067554 A, published Mar. 15, 2007; 1 page.

Non-Final Office Action directed to related U.S. Appl. No. 13/117,717, mailed Jun. 6, 2013; 6 pages.

Notice of Allowance directed to related U.S. Appl. No. 13/117,717, mailed Oct. 1, 2013; 6 pages.

Notice of Allowance directed to related U.S. Appl. No. 13/117,717, mailed Jan. 27, 2014; 5 pages.

Notice of Allowance directed to related U.S. Appl. No. 13/117,717, mailed May 8, 2014; 5 pages.

\* cited by examiner

OUTPUT SWITCHING CIRCUIT

CROSS-REFERENCE TO RELATED APPLICATION

The present application is a continuation of U.S. application Ser. No. 13/117,717, filed May 27, 2011, which claims the benefit of priority of the prior Japanese Patent Application No. 2010-193164, filed on Aug. 31, 2010, all of which are incorporated herein by reference in their entireties.

FIELD

The present embodiment relates to an output switching circuit.

BACKGROUND

An output switching circuit has been known in which the output voltage is controlled by a switching operation of a transistor.

An output switching circuit has, for example, a PWM generator that performs pulse width modulation (PWM) of an input analog signal and generates a PWM signal and a switching circuit that controls the output voltage by a switching operation based on the PWM signal.

The PWM generator has a triangular wave generating circuit and a comparator, and the voltage of the input analog signal is compared by the comparator with the voltage of the triangular wave generated by the triangular wave generating circuit. A PWM signal at a high level (H level) or low level (L level) is generated when the voltage of the input analog signal is higher or lower than the triangular wave. A D-class amplifier having such an output switching circuit discusses, for example, in Japanese Laid-open Patent Publication No. 2007-67554.

Following the advance in digitalization of electric devices, a demand has grown for scale reduction of analog circuits in output switching circuits. In particular, it is desirable that the scale of analog circuits be reduced in order to combine analog circuits and digital circuits in one chip.

Further, a triangular wave generating circuit installed in the output switching circuit is usually a self-oscillating analog oscillation circuit. For this reason, a spread in oscillation frequency between the triangular wave generating circuits caused by the production spread is difficult to inhibit. As a result, a high yield is not expected in mass production of output switching circuits.

SUMMARY

According to an aspect of the embodiments, an output switching circuit includes a switching circuit having a first transistor connected to a high-voltage power supply, a second transistor connected to a low-voltage power supply, and an output terminal at a connection node between the first and second transistors;

a comparison unit that compares an input signal with a feedback signal obtained by feedback of an output signal of the output terminal via a low-pass filter to generate a comparison signal; and a drive pulse generating unit that generates first drive pulses for driving the first transistor and second drive pulses for driving the second transistor in accordance with the comparison signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment (1)

Figure 1:
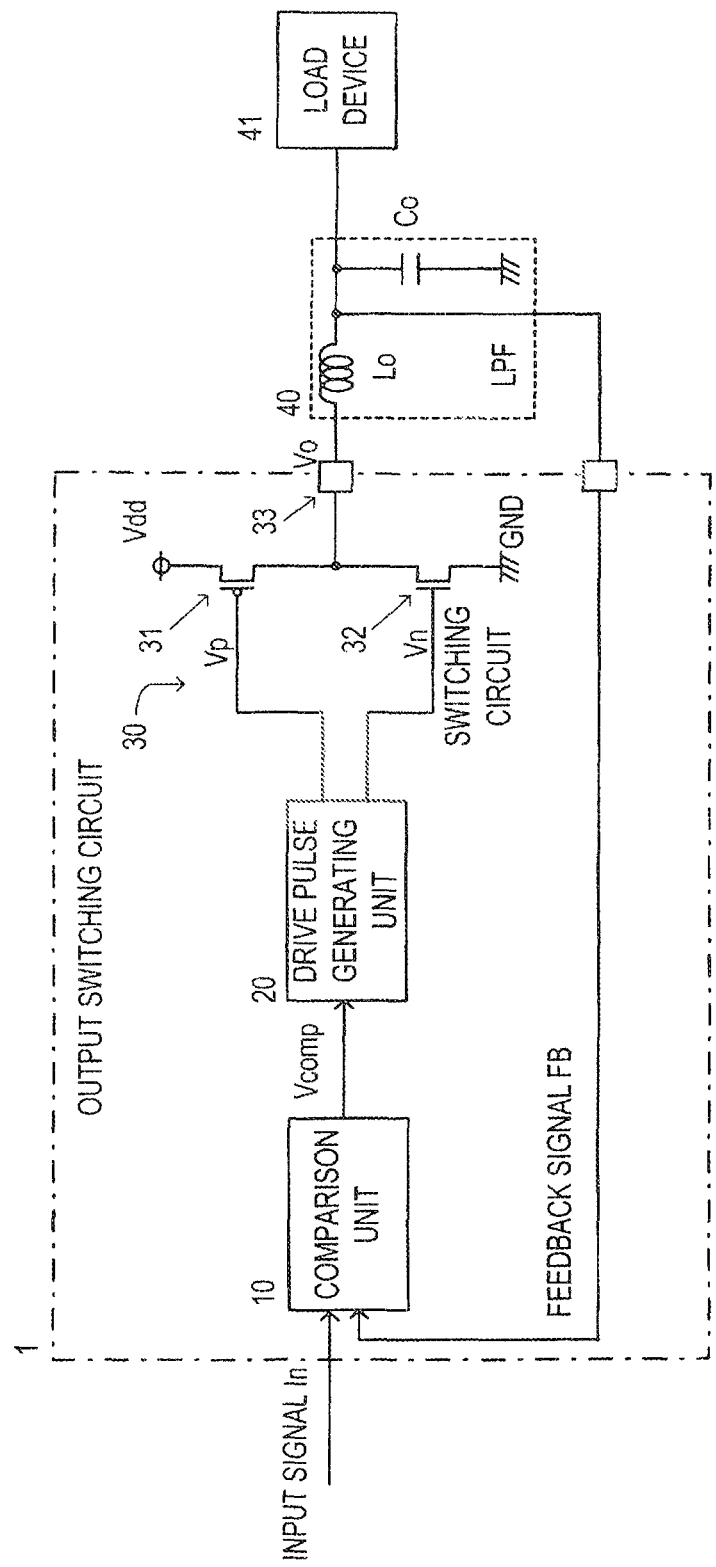
FIG. 1 illustrates the output switching circuit of the first embodiment.

FIG. 1 illustrates the output switching circuit of the first embodiment. The output switching circuit 1 has a comparison circuit 10 that compares the below-described feedback signal FB with an input signal In, a drive pulse generating unit 20 that generates drive pulses Vp, Vn according to the comparison signal Vcomp outputted from the comparison unit 10, and a switching circuit 30 operating on the basis of the drive pulses Vp, Vn outputted from the drive pulse generating unit 20.

The comparison unit 10 compares the feedback signal FB that is obtained by feedback (return) of a signal Vo, which is outputted from an output terminal 33 of the switching circuit 30, via a LPF 40 with the input signal In, generates the comparison signal Vcomp, and outputs the comparison signal to the drive pulse generating unit 20.

The drive pulse generating unit 20 generates the first drive pulses Vp for driving a first transistor 31 of the switching circuit 30 and the second drive pulses Vn for driving a second transistor 32 of the switching circuit 30 in accordance with the comparison signal Vcomp outputted from the comparison unit 10. Further, the drive pulse generating unit 20 outputs the first drive pulses Vp to the gate of the first transistor 31 and outputs the second drive pulses Vn to the gate of the second transistor 32.

The switching circuit 30 has the first transistor 31 that assumes the conductive state and non-conductive state on the basis of the first drive pulses Vp and the second transistor 32 that assumes the conductive state and non-conductive state on the basis of the second drive pulses Vn. The source of the first transistor 31 is connected to a power supply voltage Vdd of a high-voltage power source, and the source of the second transistor 32 is connected to the ground GND of a low-voltage power source. The drain of the first transistor 31 and the drain of the second transistor 32 are mutually connected. And the output terminal 33 is at a connection node between the first transistor 31 and the second transistor 32. The output terminal 33 is connected to the LPF (Low Pass Filter) 40.

The first transistor 31 is, for example, a PMOS transistor, and the second transistor 32 is, for example, a NMOS transistor. The explanation below is based on the assumption that the first transistor 31 is a PMOS transistor and the second transistor 32 is a NMOS transistor.

The LPF 40 has, for example, an inductor Lo (coil) and a capacitor Co and is a smoothing circuit that removes harmonic components contained in the signal Vo of the output terminal 33 of the switching circuit 30. This smoothing circuit smoothens out the output signal Vo and outputs the resultant signal to a load device 41. The load device 41 is, for example, a speaker or an integrated circuit. The LPF 40 also feedbacks the signal after smoothing to the comparison unit 10.

Figure 2:
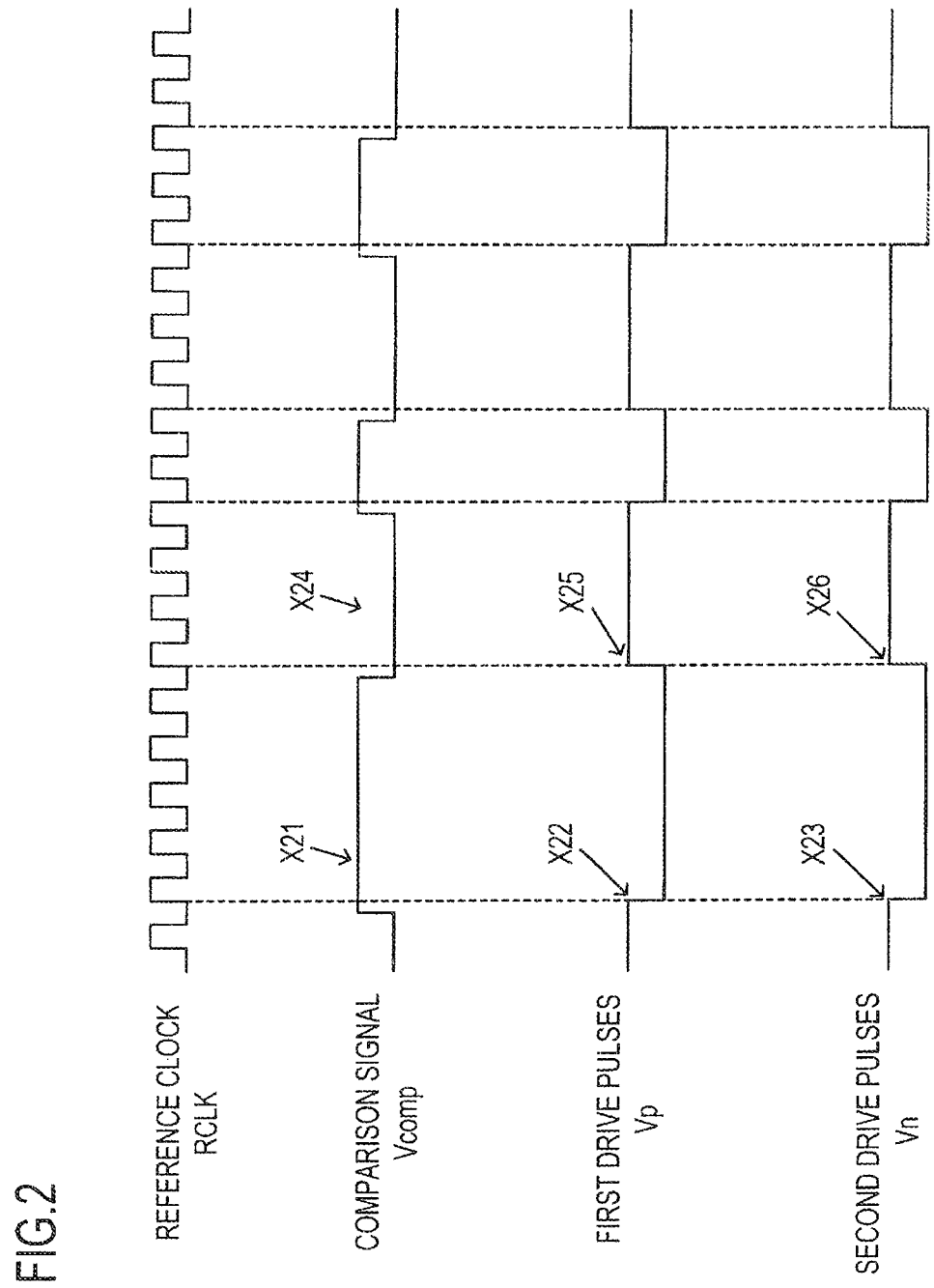
FIG. 2 is a signal waveform diagram illustrating the operation of the output switching circuit 1 illustrated in FIG. 1.

FIG. 2 is a signal waveform diagram illustrating the operation of the output switching circuit 1 illustrated in FIG. 1. Here, a signal wavefoon of reference clock RCLK, a waveform of the comparison signal Vcomp, the first drive pulses Vp, and the second drive pulses Vn are illustrated from above in the order of description.

The output switching circuit 1 illustrated in FIG. 1 will be explained below with reference to FIG. 2.

When the voltage of the input signal In is higher than the voltage of the feedback signal FB, the comparison unit 10 outputs the comparison signal Vcomp having a first level indicating that the voltage of the input signal In is higher than the voltage of the feedback signal FB, as indicated by a reference symbol X21 in FIG. 2. This first level is a high level (1).

When the comparison unit 10 outputs the high-level comparison signal Vcomp, the drive pulse generating unit 20 outputs the first drive pulses Vp having a second level synchronously with the reference clock RCLK to the gate of the first transistor 31, as indicated by a reference symbol X22 in FIG. 2. At the same time, the second drive pulses Vn having the second level are outputted synchronously with the reference clock RCLK to the gate of the second transistor 32, as indicated by a reference symbol X23 in FIG. 2. The second level is a low level (0).

The first transistor 31 is set to the conductive state by the first drive pulses Vp, whereas the second transistor 32 is set to the non-conductive state by the second drive pulses Vn. As a result, a high-level signal corresponding to the power supply voltage Vdd is outputted from the output terminal 33 of the switching circuit 30. The LPF 40 smoothens out the high-level signal, and the signal after smoothing is outputted to the load device 41 and comparison unit 10.

With the above-described operation of the switching unit 30, when the voltage of the input signal In is lower than the voltage of the feedback signal FB, the comparison unit 10 outputs the comparison signal Vcomp having the second level indicating that the voltage of the input signal In is lower than the voltage of the feedback signal FB, as indicated by a reference symbol X24 in FIG. 2. As mentioned hereinabove, the second level is the low level (0).

When the comparison unit 10 outputs the low-level comparison signal Vcomp, the drive pulse generating unit 20 outputs the high-level first drive pulses Vp synchronously with the reference clock RCLK to the gate of the first transistor 31, as indicated by a reference symbol X25 in FIG. 2. At the same time, the drive pulse generating unit 20 outputs the high-level second drive pulses Vn synchronously with the reference clock RCLK to the gate of the second transistor 32, as indicated by a reference symbol X26 in FIG. 2.

The first transistor 31 is set to the non-conductive state by the first drive pulses Vp, whereas the second transistor 32 is set to the conductive state by the second drive pulses Vn. As a result, a low-level signal corresponding to the ground GND is outputted from the output terminal 33 of the switching circuit 30. The LPF 40 smoothens out the low-level signal, and the signal after smoothing is outputted to the load device 41 and comparison unit 10.

The drive pulse generating unit of the output switching circuit explained in the first embodiment generates drive pulses of the switching circuit on the basis of a comparison result of the feedback signal and input signal. Therefore, it is possible to reduce the scale of analog circuit as much as possible. And it is possible to get rid of the triangular wave generating circuit that is easily affected by the production spread. As a result, a high yield can be realized in mass production of output switching circuits.

First Embodiment (2)

Figure 3:
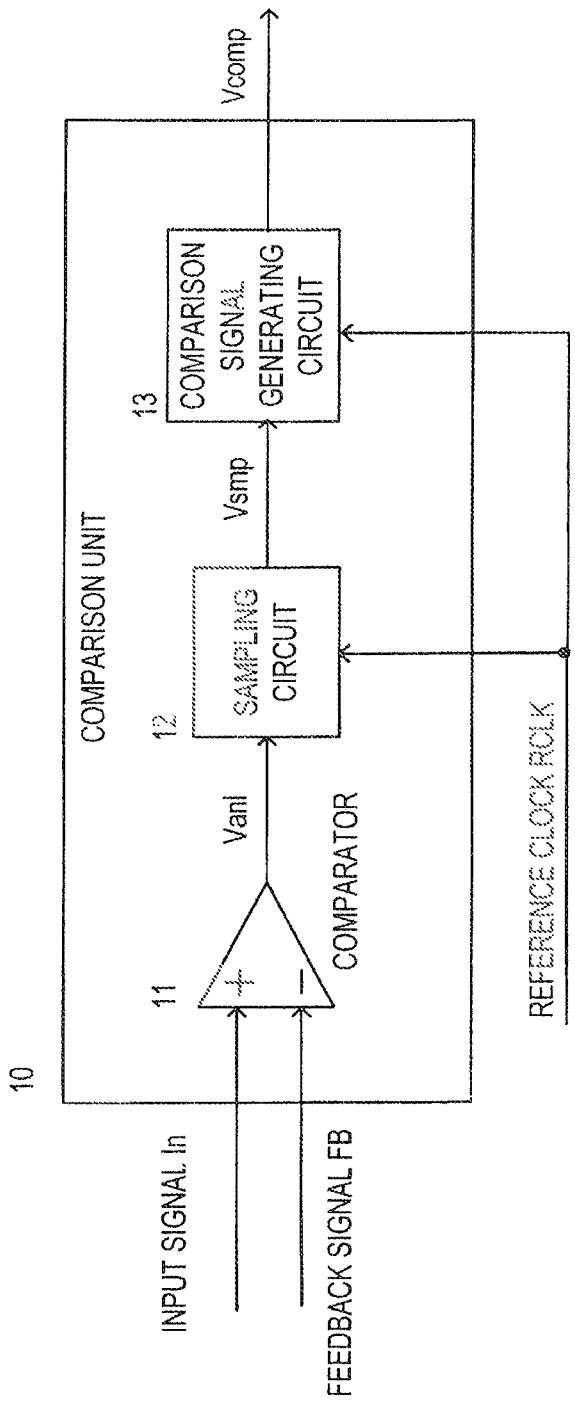
FIG. 3 illustrates the comparison unit 10 illustrated in FIG. 1.

FIG. 3 illustrates the comparison unit 10 illustrated in FIG. 1. The comparison unit 10 has a comparator 11 that compares the voltage of the feedback signal FB with the voltage of the input signal In, a sampling circuit 12 that samples the output signal of the comparator 11, and a comparison signal generating circuit 13 that generates the comparison signal Vcomp on the basis of the output signal of the sampling circuit 12.

Figure 4:
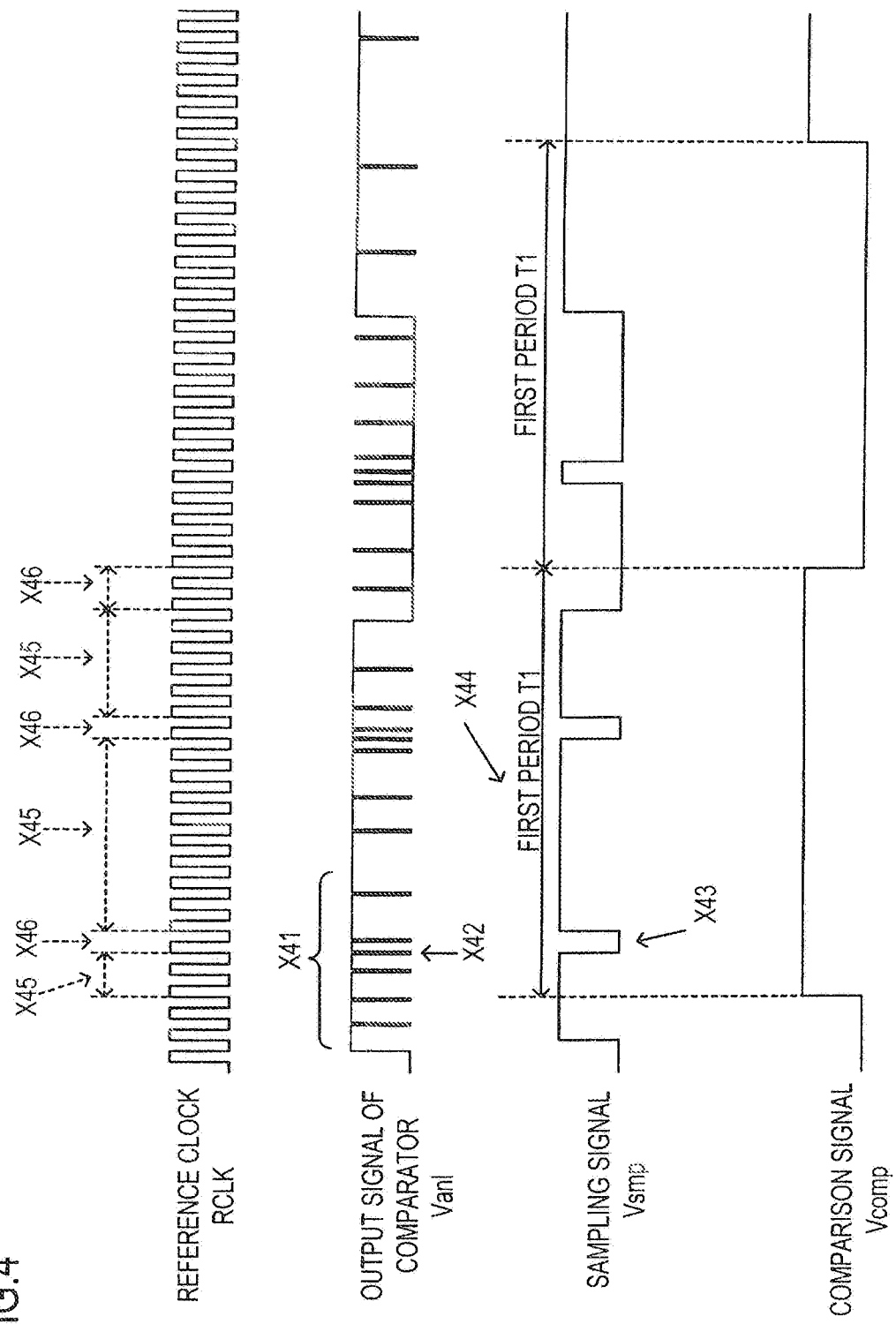
FIG. 4 is a signal waveform diagram illustrating the operation of the comparison unit 10 illustrated in FIG. 3.

FIG. 4 is a signal waveform diagram illustrating the operation of the comparison unit 10 illustrated in FIG. 3. Here, a signal waveform of reference clock RCLK, a waveform of the output signal Van1 of the comparator 11, a waveform of the sampling signal Vsmp of the sampling circuit 12, and a waveform of the comparison signal Vcomp of the comparison signal generating circuit 13 are illustrated from above in the order of description.

The comparison unit 10 illustrated in FIG. 3 will be explained below with reference to FIG. 4.

In the comparator 11, the input signal In is inputted to the non-inverted input terminal (+ terminal), and the feedback signal FB is inputted to the inverted input terminal (− terminal). The comparator 11 outputs a high-level signal when the voltage of the input signal In is higher than the voltage of the feedback signal FB and a low-level signal when the voltage of the input signal In is lower than the voltage of the feedback signal FB.

Where the level difference between the voltage of the feedback signal FB having noise mixed therewith and the voltage of the input signal In also having noise mixed therewith is small when the two voltages are compared, the level of the output voltage Van1 of the comparator 11 changes harmonically from the high level to the low level and from the low level to the high level (the so-called, fluttering of the signal level), as indicated by the reference symbol X41 in FIG. 4. Since the voltage level difference between the feedback signal FB and the input signal In is small and noise is mixed with both signals, as mentioned hereinabove, the output voltage Van1 does not accurately reflect the voltage level difference between the feedback signal FB and the input signal In. For this reason, when the comparison unit 10 directly outputs the output signal Van1 of the comparator 11 as the comparison signal Vcomp, the drive pulse generating unit 20 does not generate the adequate drive pulses. Accordingly, the sampling circuit 12 is provided at the last stage of the comparator 11.

The sampling circuit 12 samples the output signal Van1 of the comparator 11 at the reference clock RCLK and generates a sampling signal Vsmp. More specifically, the sampling circuit 12 latches the output signal Van1 of the comparator 11 at a rise timing of the reference clock RCLK, as indicated by the reference symbol X42 in FIG. 4, and generates the sampling signal Vsmp illustrated in FIG. 4.

However, even if the sampling signal Vsmp is thus generated, where high-frequency variations are included in the output signal Van1 of the comparator 11, these variations appear in the sampling signal Vsmp, as indicated by the reference symbol X43 in FIG. 4. Accordingly, the comparison signal generating circuit 13 is provided at the last stage of the sampling circuit 12.

The comparison signal generating circuit 13 generates the comparison signal Vcomp having a high level or a low level and having a pulse width of a first period T1, which is sufficiently longer that the reference clock RCLK for sampling, in accordance with the high-level or low-level pulse width of the sampling signal Vsmp for each first period T1.

More specifically, the comparison signal generating circuit 13 compares the clock number of the reference clock RCLK corresponding to the high-level pulse width within the first period T1 of the sampling signal Vsmp (referred to hereinbelow simply as "high-level clock number") with the clock number of the reference clock RCLK corresponding to the low-level pulse width (referred to hereinbelow simply as "low-level clock number"). The signal level with the larger clock number is then taken as a level of the comparison signal Vcomp in the first period T1. For example, in the first period T1 indicated by the reference symbol X44 in FIG. 4, the clock number within the range indicated by the reference symbol X45 corresponds to a high-level clock number, and the clock number within the range indicated by the reference symbol X46 corresponds to the low-level clock number. In the first period T1, the high-level clock number is larger than the low-level clock number and therefore the comparison signal generating circuit 13 generates the high-level comparison signal Vcomp in the first period T1. In the next first period T1, the situation is reversed.

Since the comparison unit generates a comparison signal in the above-described manner, it is possible to generate an adequate comparison signal that accurately reflects the voltage level difference between the feedback signal and the input signal even when the output signal flutters.

Further, since only the comparator is used as an analog circuit, the scale of analog circuitry can be greatly reduced. As a result, the circuit surface area can be greatly reduced, spread in production process can be inhibited, and circuit design is facilitated. Therefore, the production cost and design cost can be reduced. In addition, the analog circuit and digital circuits can be easily formed in one chip.

Second Embodiment

Figure 5:
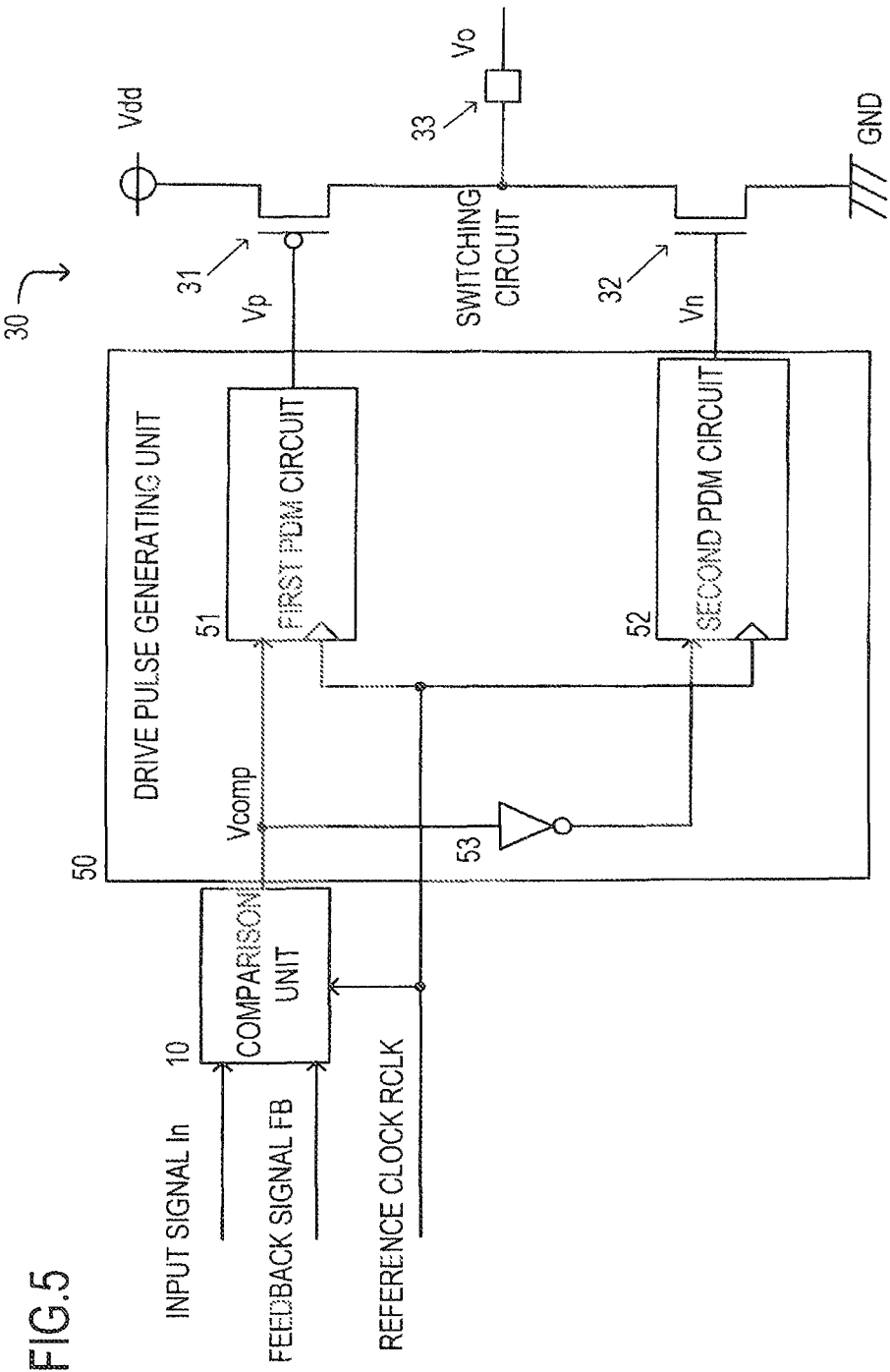
FIG. 5 illustrates a drive pulse generating unit of the second embodiment.

FIG. 5 illustrates a drive pulse generating unit of the second embodiment. The drive pulse generating unit 50 has a first PDM circuit 51 generating first drive pulses Vp on the basis of the comparison signal Vcomp outputted by the comparison unit 10 and a second PDM circuit 52 that generates second drive pulses Vn on the basis of the comparison signal Vcomp inverted by an inverter 53.

While the signal inputted to the first PDM circuit 51 (comparison signal Vcomp) is a high-level signal, the first PDM circuit 51 generates first drive pulses Vp obtained by pulse density modulation (PDM) of this high-level input signal on the basis of the reference clock RCLK, and outputs the generated first drive pulses to the first transistor 31 of the switching circuit 30. The first drive pulses Vp have a pulse train with a frequency higher than that of the first period T1. In other words, the pulses of the first drive pulses Vp within an interval in which the comparison signal Vcomp is at a high level become a pulse train identical to the reference clock RCLK. Further, within an interval in which the inputted signal is at a low level, the first PDM circuit 51 outputs the high-level first drive pulses Vp to the first transistor 31.

While the signal inputted to the second PDM circuit 52 (inverted comparison signal Vcomp) is a high-level signal, the second PDM circuit 52 generates second drive pulses Vn obtained by pulse density modulation of this high-level input signal on the basis of the reference clock RCLK in the same manner as in the first PDM circuit 51, and outputs the generated second drive pulses to the second transistor 32 of the switching circuit 30. The second drive pulses Vn have a pulse train with a frequency higher than that of the first period T1. In other words, the pulses of the second drive pulses Vn within an interval in which the comparison signal Vcomp is at a low level become a pulse train identical to the reference clock RCLK. Further, while the inputted signal is at a low level, the second PDM circuit 52 outputs the low-level second drive pulses Vn to the second transistor 32.

Figure 6:
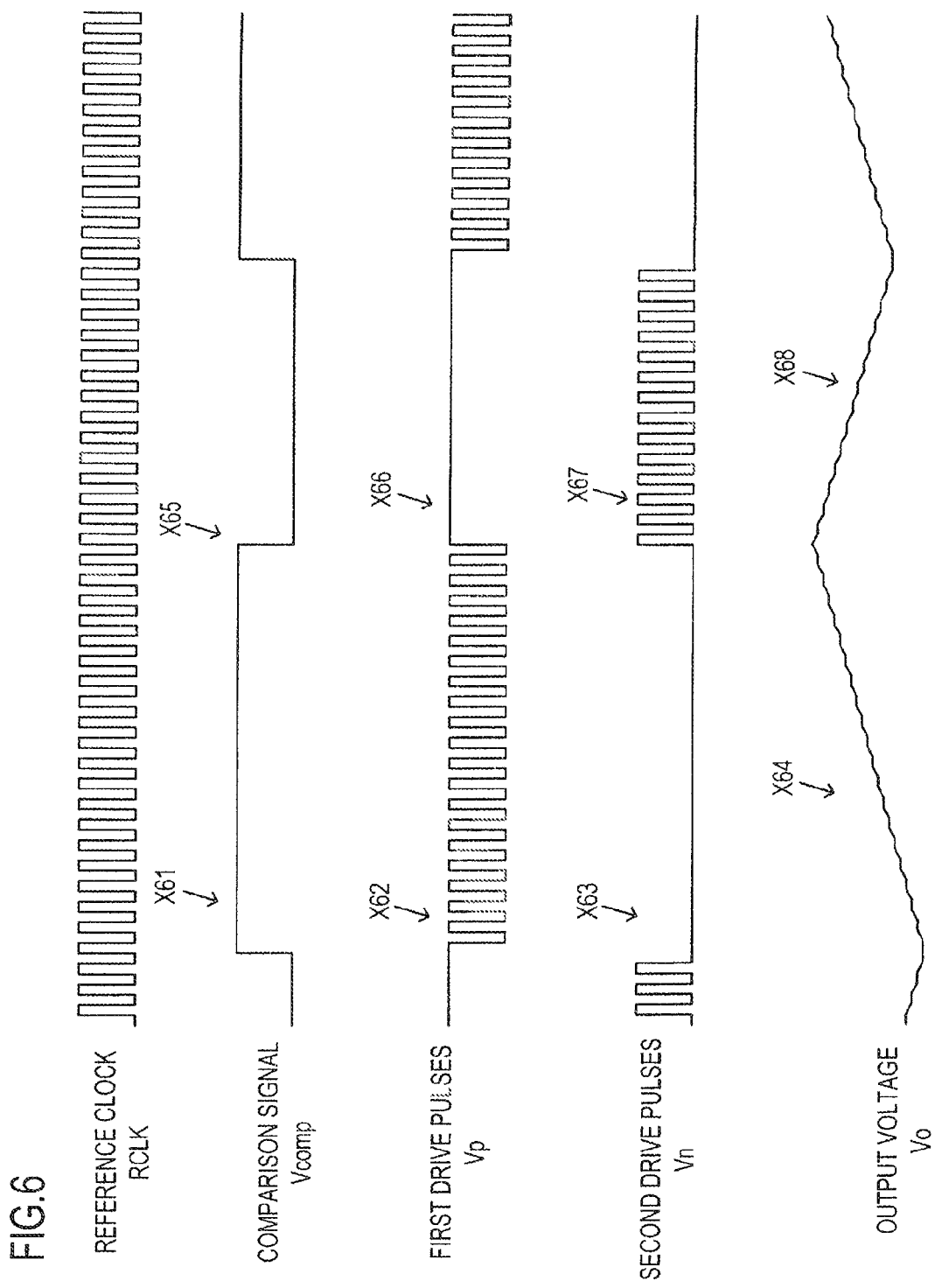
FIG. 6 is a signal waveform diagram illustrating the operation of the drive pulse generating unit 50 illustrated in FIG. 5.

FIG. 6 is a signal waveform diagram illustrating the operation of the drive pulse generating unit 50 illustrated in FIG. 5. Here, a signal waveform of reference clock RCLK, a waveform of the comparison signal Vcomp, the first drive pulses Vp, the second drive pulses Vn, and an output voltage (output signal) Vo of the switching circuit 30 are illustrated from above in the order of description.

The drive pulse generating unit 50 illustrated in FIG. 5 will be explained below with reference to FIG. 6.

While the comparison signal Vcomp is at a high level, as indicated by the reference symbol X61 in FIG. 6, the first PDM circuit 51 generates the first drive pulses Vp having the high-frequency pulse train indicated by the reference symbol X62 in FIG. 6. This first drive pulses Vp are the pulses of the reference clock RCLK.

While the comparison signal Vcomp is at a high level, the second PDM circuit 52 generates the low-level second drive pulses Vn indicated by the reference numeral X63 in FIG. 6. As for the level of the input signal of the second PDM circuit 52, the high-level comparison signal Vcomp is inverted by the inverter 53 to a low level.

The first transistor 31 of the switching circuit 30 is repeatedly switched at a high rate between the conductive state and non-conductive state by the first drive pulses Vp. By contrast, the second transistor 32 is switched to the non-conductive state by the second drive pulses Vn. As a result, the output voltage Vo of the switching circuit 30 rises gradually as indicated by the reference symbol X64 illustrated in FIG. 6.

When the output voltage Vo rises, the voltage of the feedback signal FB becomes higher than the voltage of the input signal In. As a result, the comparison unit 10 outputs the low-level comparison signal Vcomp indicated by the reference symbol X65 in FIG. 6.

While the comparison signal Vcomp is at a low level, the first PDM circuit 51 generates the high-level first drive pulses Vp indicated by the reference symbol X66 in FIG. 6. By contrast, while the comparison signal Vcomp is at a low level, the second PDM circuit 52 generates the second drive pulses Vn having a high-frequency pulse train indicated by the reference symbol X67 in FIG. 6. The second drive pulses Vn are the pulses of the reference clock RCLK.

The first drive pulses Vp switch the first transistor 31 of the switching circuit 30 to the non-conductive state, whereas the second drive pulses Vn switch the second transistor 32 repeatedly to the conductive state and non-conductive state at a high rate. As a result, the output voltage Vo of the switching circuit 30 decreases gradually as indicated by reference symbol X68 in FIG. 6.

When the output voltage Vo decreases, the voltage of the feedback signal FB becomes lower than the voltage of the input signal In. As a result, the comparison unit 10 outputs the high-level comparison signal Vcomp. Subsequent processing is described above and the explanation thereof is herein omitted.

With the second embodiment, it is possible to miniaturize the LPF that smoothens out the output voltage (output signal) of the switching circuit. The reason therefor will be explained by using Eq. (1).

$$fc = \frac{1}{2\pi\sqrt{LC}} \quad \text{[Formula 1]}$$

Eq. (1) indicates the relationship between the cut-off frequency (fc) of the LPF, "L" (self-inductance), and "C" (capacitance of the capacitor) when a primary LC filter is used as the LPF.

As described hereinabove, the switching circuit is drive controlled by high-frequency drive pulses and outputs the output signal Vo such as illustrated in FIG. 6. The high-frequency pulses do not include low harmonic components, as compared with low-frequency pulses. Therefore, the output signal of the switching circuit that is drive controlled by the high-frequency drive pulses includes no low harmonic components, as compared with the output signal of the switching circuit that is drive controlled by low-frequency drive pulses. Therefore, it is not necessary for the LPF that smoothens out the output signals generated by the high-frequency drive pulses to cut off the low harmonic components. As a result, the cut-off frequency of the LPF can be increased. Where the cut-off frequency of the LPF can be increased, "L" and "C" are decreased, as indicated by Eq. (1) and therefore the LPF can be miniaturized.

Further, since the switching circuit is drive controlled by the high-frequency drive pulses, changes between the non-conductive state and conductive state of the transistors can be increased in rate. As a result, the number of adjustment cycles of the output voltage within a constant time interval increases, that is, the resolution increases and therefore distortions of the output signal of the LPF are reduced.

Further, since the transistors are not maintained in the conductive state, and the non-conductive state and conductive state are repeated at a high rate, the output voltage of the switching circuit does not increase or decrease abruptly. As a result, overshoot and undershoot of the output signal of the LPF are prevented. In addition, since the first transistor and the second transistor are not in the conductive state at the same time, a through current does not flow in the switching circuit.

Third Embodiment

The case is assumed in which the output switching circuit explained in the second embodiment is caused to function, for example, as a DCDC converter. In this case, the voltage level of the input signal In of the output switching circuit is constant. Further, at a certain desired power (load) of the load device, the level of the comparison signal Vcomp outputted from the comparison unit 10 is continuous, the high-level state is maintained, and the output voltage Vo is not controlled to the optimum value. In the third embodiment, the drive pulse generation processing is explained which is executed when the level of the comparison signal Vcomp outputted from the comparison unit 10 is continuous and the high-level state is maintained.

Figure 7:
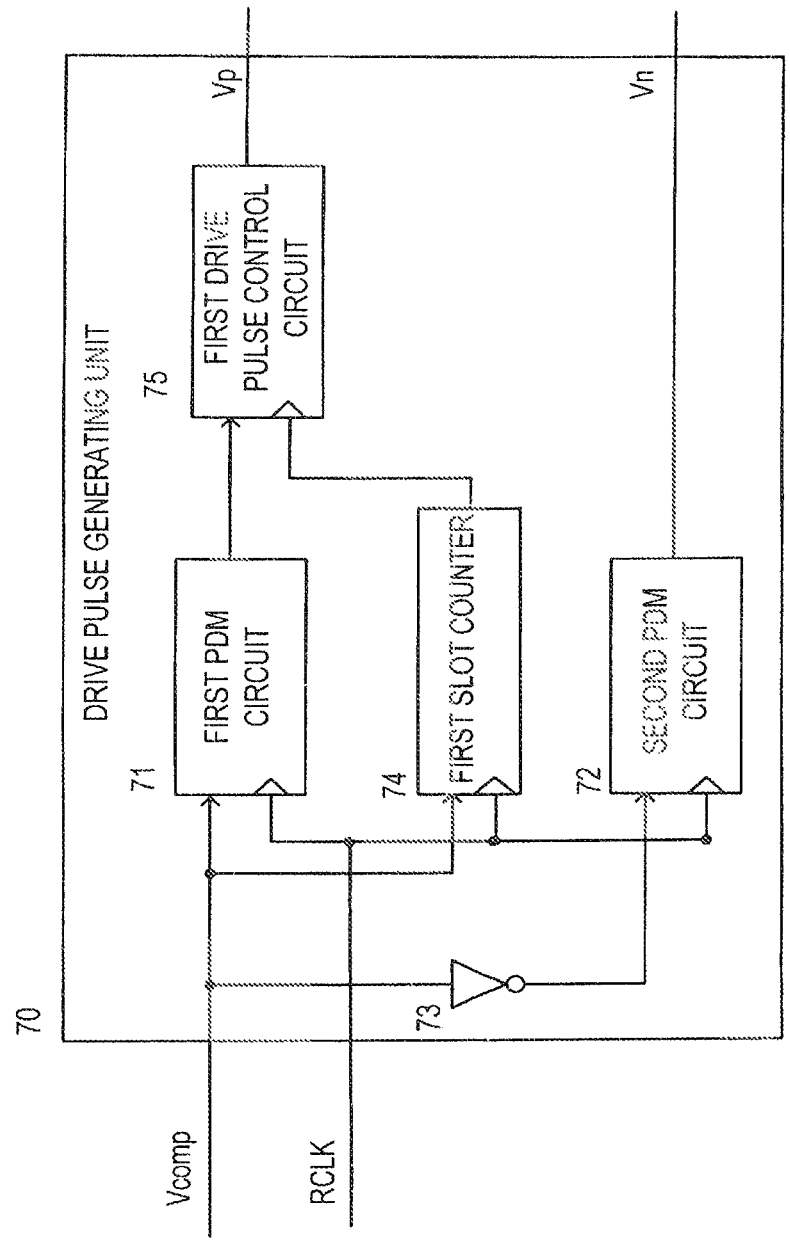
FIG. 7 illustrates a drive pulse generating unit 70 of the third embodiment.

FIG. 7 illustrates a drive pulse generating unit 70 of the third embodiment. The drive pulse generating unit 70 has a first PDM circuit 71, a second PDM circuit 72, an inverter 73, a first slot counter 74 that counts the number of second periods T2 that are shorter than the first period T1, and a first drive pulse control circuit 75 that controls the number of the first drive pulses Vp.

Figure 8:
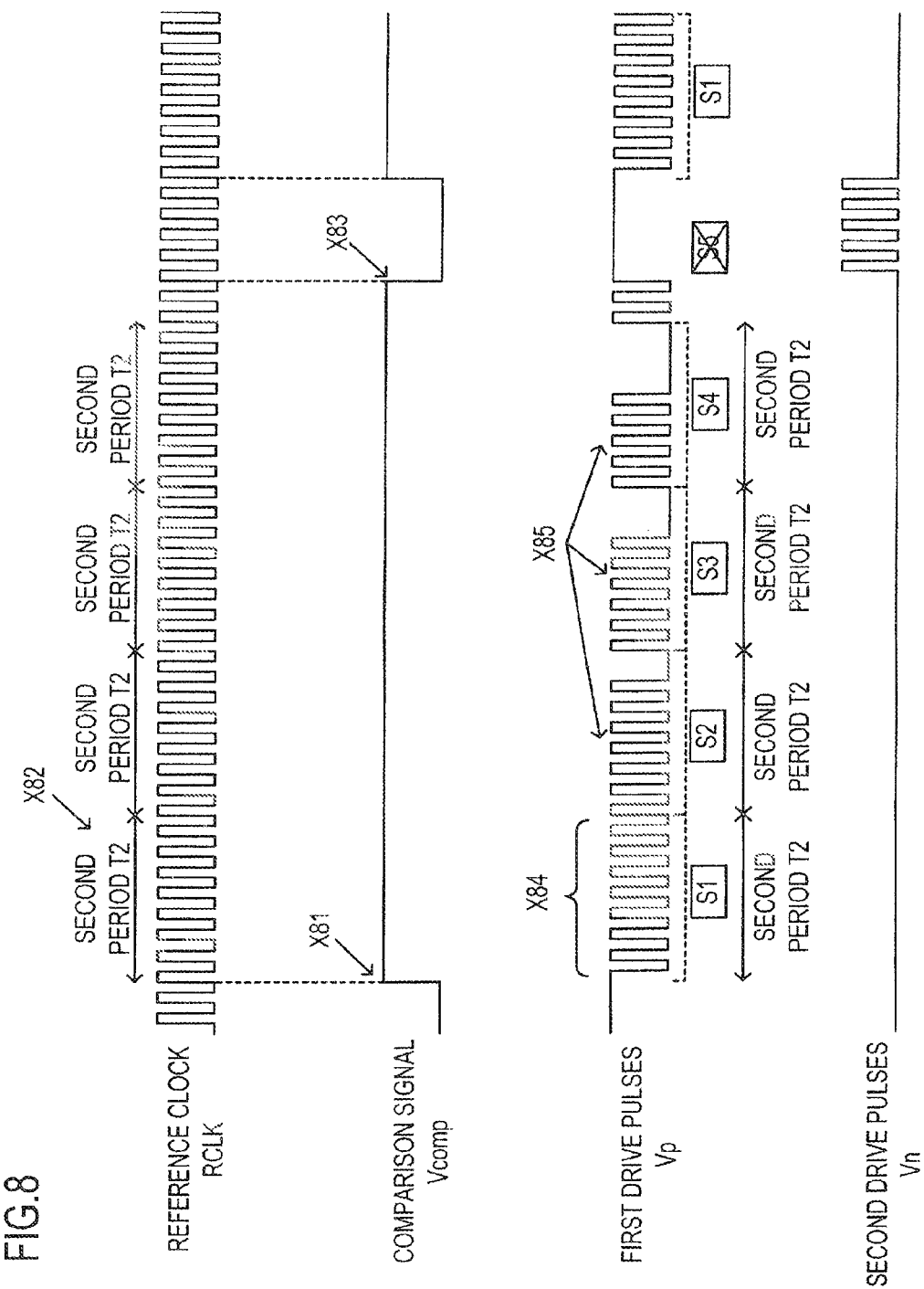
FIG. 8 is a signal waveform diagram illustrating the operation of the drive pulse generating unit 70 illustrated in FIG. 7.

FIG. 8 is a signal waveform diagram illustrating the operation of the drive pulse generating unit 70 illustrated in FIG. 7. Here, a signal waveform of reference clock RCLK, a waveform of the comparison signal Vcomp, the first drive pulses Vp, and the second drive pulses Vn are illustrated from above in the order of description.

The drive pulse unit illustrated in FIG. 7 will be explained hereinbelow with reference to FIG. 8. The first PDM circuit 71 and the second PDM circuit 72 function similarly to the first PDM circuit 51 and the second PDM 52 circuit illustrated in FIG. 5, and the inverter 73 functions similarly to the inverter 53 illustrated in FIG. 5. Accordingly, the explanation of these components is omitted.

The first slot counter 74 counts the number of the second periods T2, while the signal inputted to the first slot counter 74 (comparison signal Vcomp) is at a high level, on the basis of the reference clock RCLK.

In the example illustrated in FIG. 8, when the comparison signal Vcomp is at a high level (the input signal of the first slot counter 74 is at a high level), as indicated by the reference symbol X81, the first slot counter 74 counts the number of the second periods T2 corresponding to eight periods of the reference clock RCLK, as indicated by the reference symbol X82. The first slot counter 74 outputs the count results to the first drive pulse control circuit 75. In the examples illustrated in FIG. 8, when the comparison signal Vcomp is at a high level, the first slot counter 74 counts the number of the second periods T2 as 1 to 4. When the comparison signal Vcomp is at a low level, the count result is reset. Referring to FIG. 8, the comparison signal Vcomp assumes a low level, as indicated by the reference symbol X83, at a fifth count, and the count result is reset. In the explanation below, the slots in the first drive pulse Vp will be called S1 to S5 in the order from the left side in the figure for each second period T2, and these slots correspond to counts 1 to 5, as illustrated in FIG. 8. In FIG. 8, eight periods of the reference clock RCLK are taken as the second period T2, but the eight periods are not limiting.

The first drive pulse control circuit 75 gradually increases the conduction time of the first transistor 31 in the first drive pulses Vp for each second period T2 while the comparison signal Vcomp is at a high level. For example, when the comparison signal Vcomp assumes a high level, the first drive pulse control circuit 75 controls the number of conduction pulses of the first drive pulses Vp in the initial second period T2 to the first number. Then, the first drive pulse control circuit 75 gradually replaces the non-conduction pulses of the first transistor 31 in the first drive pulses Vp with the conduction pulses for each second period T2, thereby gradually increasing the width of conduction pulses. The conduction pulse corresponds to a low-level pulse that switches the first transistor 31 to the conduction state, and the non-conduction pulse corresponds to a high-level pulse that switches the first transistor 31 to the non-conduction state.

More specifically, when the first slot counter 74 counts one second period T2 (slot S1), the first drive pulse control circuit 75 controls the number of low-level pulses in the first drive pulses Vp outputted by the first PDM circuit 71 to 8, as indicated by the reference symbol X84 in FIG. 8. Then, when the first slot counter 74 counts 2, 3, and 4 second periods T2 (slots S2 to S4), the first drive pulse control circuit 75 gradually replaces the high-level pulses of the first drive pulses Vp outputted by the first PDM circuit 71 with low-level pulses, as indicated by the reference symbol X85 in FIG. 8, in order to increase gradually the conduction time of the first transistor 31. In such a manner, the first drive pulse control circuit 75 gradually decreases the number of high-level pulses correspondingly to slots S2 to S4 and gradually increases the low-level pulse width (conduction pulse width of the first transistor 31).

The reason for such an extension of the time interval in which the first transistor 31 is conductive will be explained below. When the high-level state of the comparison signal Vcomp is maintained for a long time, the load of the load device 41 is high and the conduction time of the first transistor 31 is apparently insufficient. Accordingly, the level of the output voltage Vo can be controlled to the level adapted even to a high load by gradually increasing the conduction time of the first transistor 31.

In the example above, the initial number of low-level pulses is 8, but the number of pulses may be less than 8, that is, for example 7 or 6. Further, in the example illustrated in FIG. 8, the low-level pulse width is gradually enlarged in the second half of the second periods T2, but the low-level pulse width may be also gradually enlarged in the first half.

According to the third embodiment, voltage control can be performed such that the rise amount of the output signal level is increased and rapidly adapted to the level variations of the comparison signal by increasing the conduction time of the first transistor in the case in which the comparison signal is maintained in the high-level state. Thus, the responsiveness of the output signal to level variations of the comparison signal can be improved.

Fourth Embodiment (1)

In the fourth embodiment, a drive pulse generation processing is explained that is executed when the level of the comparison signal Vcomp of the comparison unit 10 is maintained in a low-level state.

Figure 9:
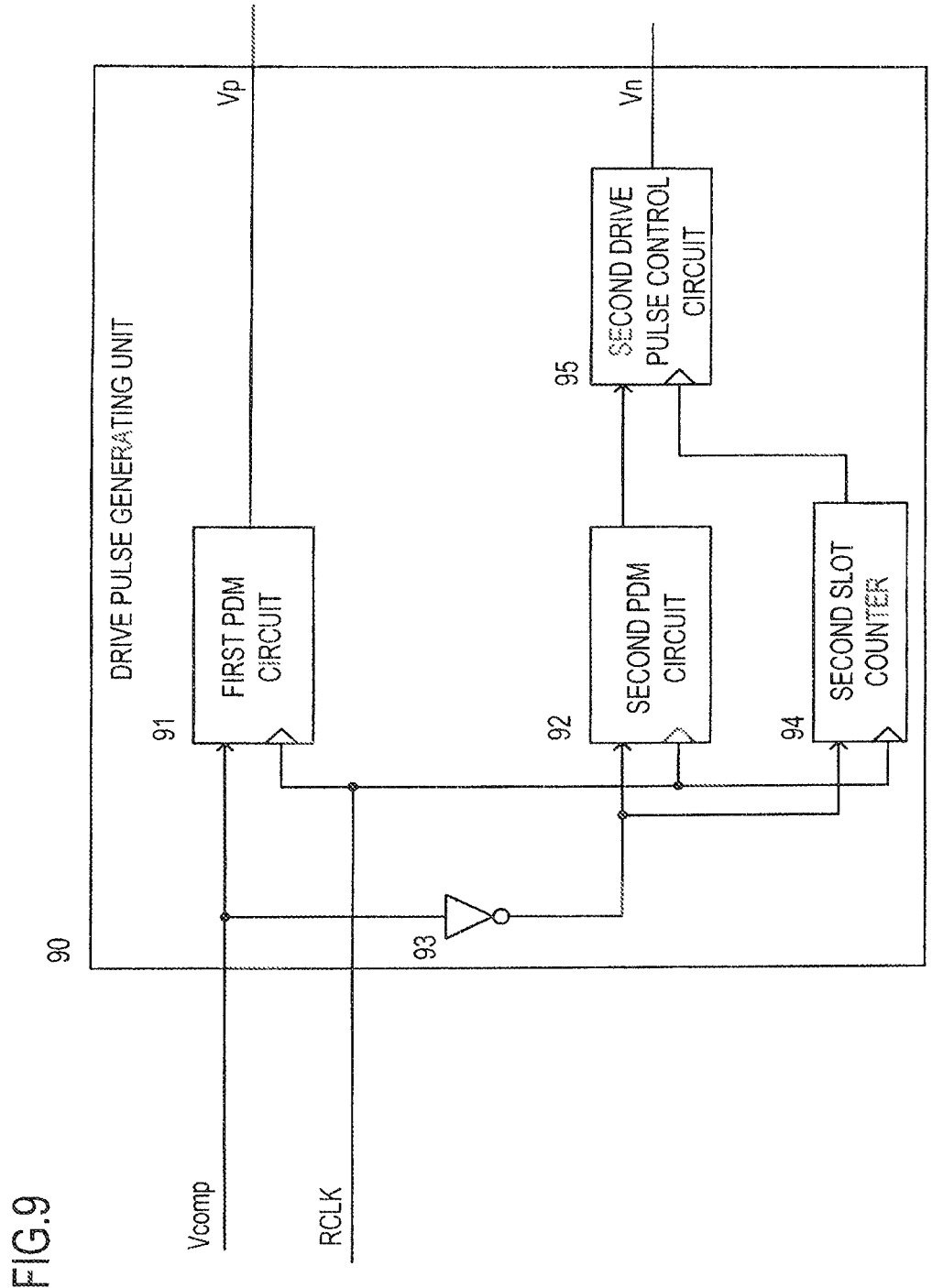
FIG. 9 illustrates a drive pulse generating unit 90 according to the fourth embodiment.

FIG. 9 illustrates a drive pulse generating unit 90 according to the fourth embodiment. The drive pulse generating unit 90 has a first PDM circuit 91, a second PDM circuit 92, an inverter 93, a second slot counter 94 that counts the number of second periods T2, and a second drive pulse control circuit 95 that controls the number of second drive pulses Vn.

Figure 10:
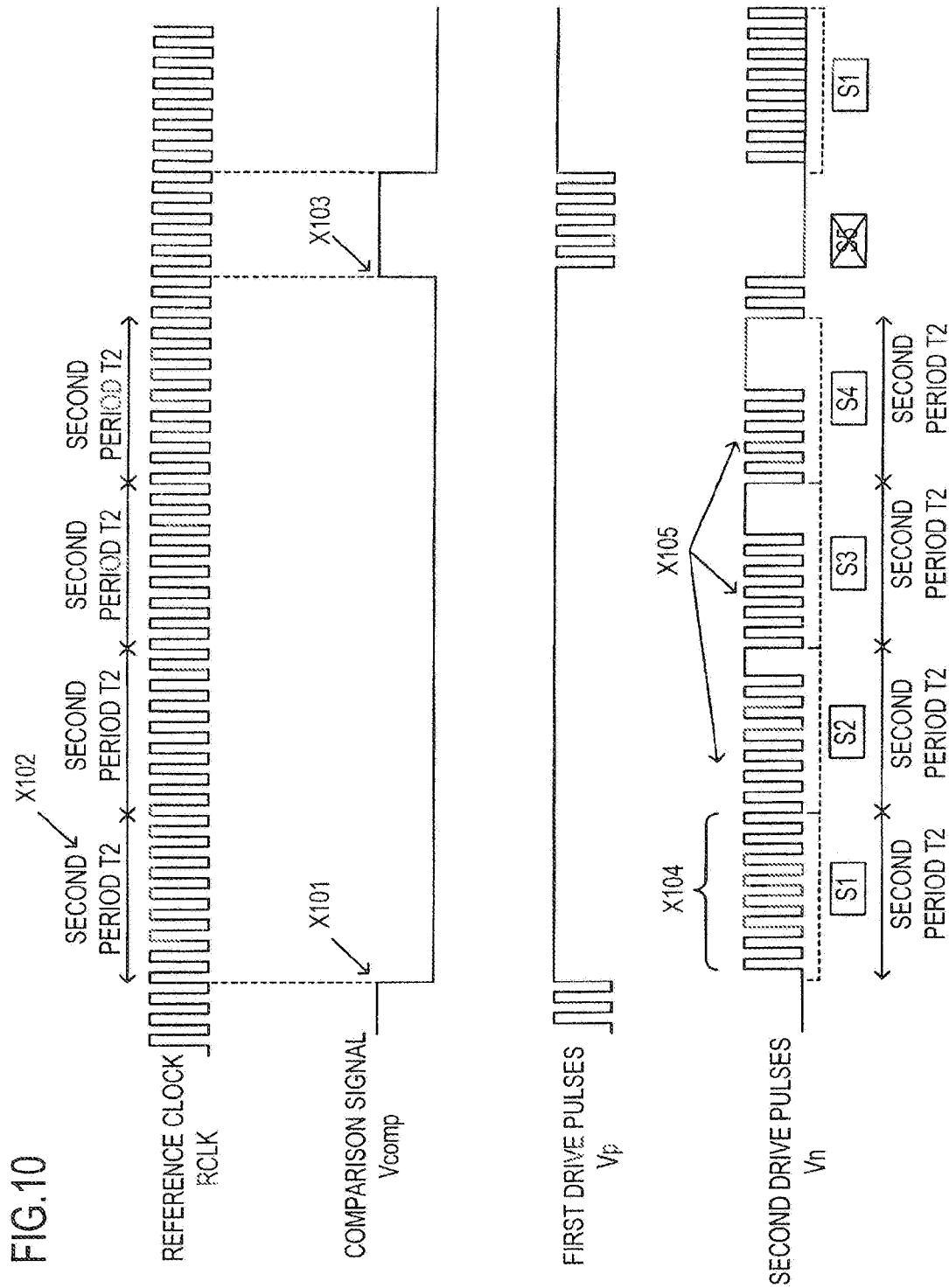
FIG. 10 is a signal waveform diagram illustrating the drive pulse generating unit 90 illustrated in FIG. 9.

FIG. 10 is a signal waveform diagram illustrating the drive pulse generating unit 90 illustrated in FIG. 9. Here, a signal waveform of reference clock RCLK, a waveform of the comparison signal Vcomp, the first drive pulses Vp, and the second drive pulses Vn are illustrated from above in the order of description.

The drive pulse unit illustrated in FIG. 9 will be explained below with reference to FIG. 10. The first PDM circuit 91 and the second PDM circuit 92 function similarly to the first PDM circuit 51 and the second PDM 52 circuit illustrated in FIG. 5, and the inverter 93 functions similarly to the inverter 53 illustrated in FIG. 5. Accordingly, the explanation of these components is omitted.

The second slot counter 94 has functions similar to those of the first slot counter 74 illustrated in FIG. 7 and counts the number of the second periods T2 while the signal inputted to the second slot counter 94 is at a high level (comparison signal Vcomp is at a low level) on the basis of the reference clock RCLK.

In the example illustrated in FIG. 10, when the comparison signal Vcomp is at a low level (the input signal of the second slot counter 94 is at a high level), as indicated by the reference symbol X101, the second slot counter 94 counts the number of the second periods T2 corresponding to eight periods of the reference clock RELIC, as indicated by the reference symbol X102. The second slot counter 94 outputs the count results to the second drive pulse control circuit 95. In the example illustrated in FIG. 10, while the comparison signal Vcomp is at a low level, the second slot counter 94 counts the number of the second periods T2 as 1 to 4. When the comparison signal Vcomp is at a high level, the count result is reset. Referring to FIG. 10, the comparison signal Vcomp assumes a high level, as indicated by the reference symbol X103, at a fifth count, and the count result is reset. In the explanation below, the slots in the second drive pulse Vn will be called S1 to S5 in the order from the left side in the figure for each second period T2, and these slots correspond to counts 1 to 5, as illustrated in FIG. 10. In FIG. 10, eight periods of the reference clock RCLK are taken as the second period T2, but the eight periods are not limiting.

The second drive pulse control circuit 95 gradually increases the conduction time of the second transistor 32 in the second drive pulses Vn for each second period T2 while the comparison signal Vcomp is at a low level. For example, when the comparison signal Vcomp assumes a low level, the second drive pulse control circuit 95 controls the number of conduction pulses of the second drive pulses Vn in the initial second period T2 to the second number. Then, the second drive pulse control circuit 95 gradually replaces the non-conduction pulses of the second transistor 32 in the second drive pulses Vn with the conduction pulses for each second period T2, thereby gradually increasing the width of conduction pulses. The conduction pulse corresponds to a high-level pulse that switches the second transistor 32 to the conduction state, and the non-conduction pulse corresponds to a low-level pulse that switches the second transistor 32 to the non-conduction state.

More specifically, when the second slot counter 94 counts one second period T2 (slot S1), the second drive pulse control circuit 95 controls the number of high-level pulses in the second drive pulses Vn outputted by the second PDM circuit 92 to 8, as indicated by the reference symbol X104 in FIG. 10. Then, when the second slot counter 94 counts 2, 3, and 4 second periods T2 (slots S2 to S4), the second drive pulse control circuit 95 gradually replaces the low-level pulses of the second drive pulses Vn outputted by the second PDM circuit 92 with high-level pulses, as indicated by the reference symbol X105 in FIG. 10, in order to increase gradually the conduction time of the second transistor 32. In such a manner, the second drive pulse control circuit 95 gradually decreases the number of low-level pulses correspondingly to slots S2 to S4 and gradually increases the high-level pulse width (conduction pulse width of the second transistor 32).

The reason for such an extension of the time interval in which the second transistor 32 is conductive will be explained below. When the low-level state of the comparison signal Vcomp is maintained for a long time, the load of the load device 41 is low, the electric charge accumulated in the capacitor Co of the LPF 40 is not entirely drawn out to the ground GND and the load device 41, and the decrease amount of the output voltage Vo is small. Thus, the conduction time of the second transistor 32 seems to be insufficient. Accordingly, the level of the output voltage Vo can be controlled to the level adapted even to a low load by gradually increasing the conduction time of the second transistor 32.

In the example above, the initial number of low-level pulses is 8, but the number of pulses may be less than 8, that is, for example 7 or 6. Further, in the example illustrated in FIG. 10, the high-level pulse width is gradually enlarged in the second half of the second periods T2, but the high-level pulse width may be also gradually enlarged in the first half.

Fourth Embodiment (2)

Figure 11:
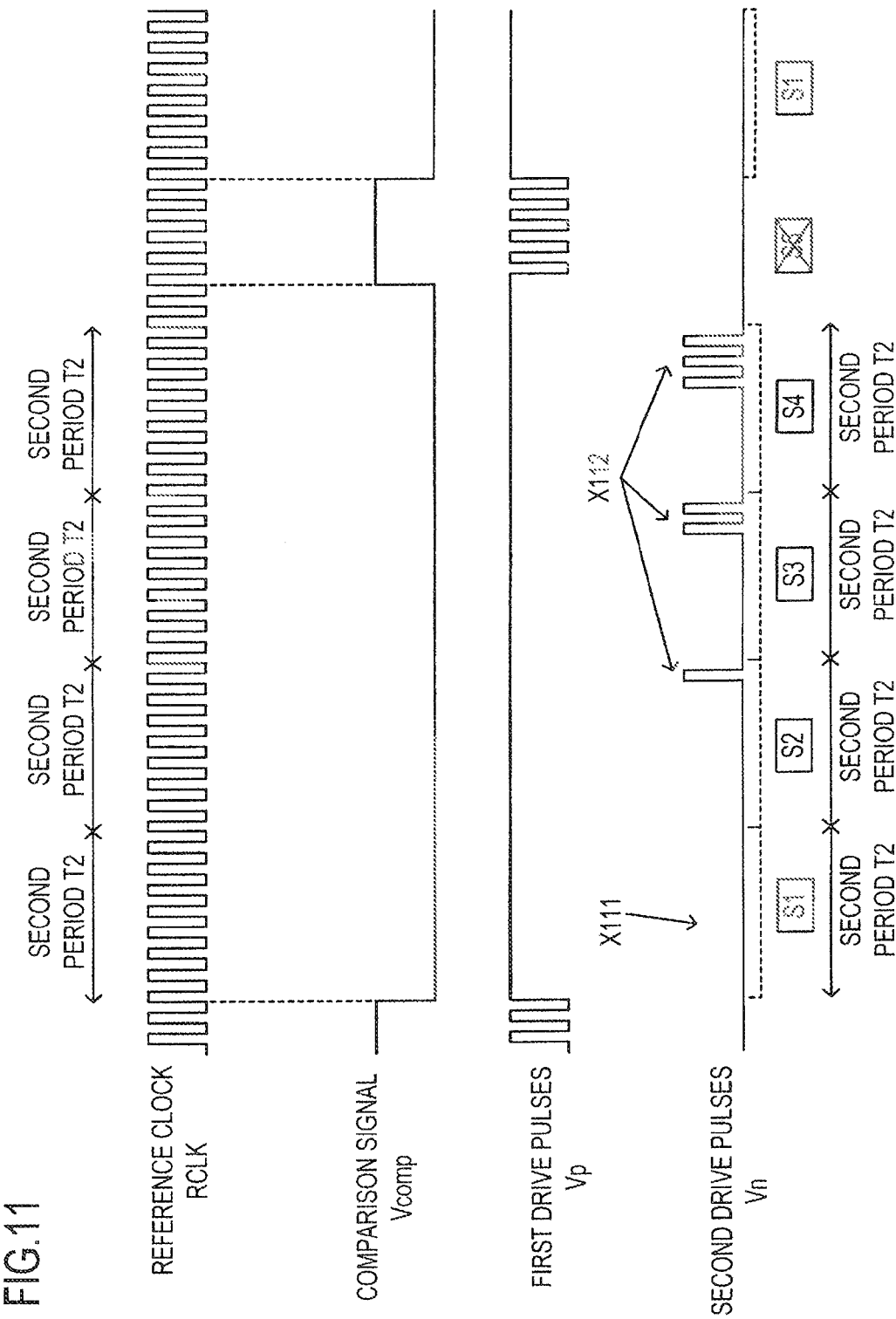
FIG. 11 is a signal waveform diagram illustrating another control conducted to increase gradually the conduction time of the second transistor 32 in the second drive pulses Vn in each second period T2.

FIG. 11 is a signal waveform diagram illustrating another control conducted to increase gradually the conduction time of the second transistor 32 in the second drive pulses Vn in each second period T2, this diagram corresponding to the signal waveform diagram illustrated in FIG. 10.

When the comparison signal Vcomp assumes a low level, the second drive pulse control circuit 95 controls the number of conduction pulses of the second transistor 32 in the second drive pulses Vn in the initial second period T2, for example, to 0. Then, the second drive pulse control circuit 95 gradually increases the number of conduction pulses of the second drive pulses Vn in each second period T2. The conduction pulse corresponds to a high-level pulse.

More specifically, when the second slot counter 94 counts one second period T2 (slot S1), the second drive pulse control circuit 95 controls the number of high-level pulses in the second drive pulses Vn outputted by the second PDM circuit 92 to 0, as indicated by the reference symbol X111 in FIG. 11. Then, when the second slot counter 94 counts 2, 3, and 4 second periods T2 (slots S2 to S4), the second drive pulse control circuit 95 gradually increases the number of high-level pulses in the second drive pulses Vn correspondingly to the slots S2 to S4, as indicated by the reference symbol X112 in FIG. 11, in order to increase gradually the conduction time of the second transistor 32.

The reason for setting the initial number of high-level pulses to 0 will be explained below. When the load of the load device 41 is high, the load device 41 draws out sufficiently the electric charge accumulated in the capacitor Co of the LPF 40 and the output voltage Vo can be significantly decreased. Therefore, it is possible that the second transistor 32 is conductive and the electric charge is not drawn out to the ground GND. However, the load of the load device 41 can be reduced by the operation of the load device 41. As a result, where the second transistor 32 is not made conductive, the output voltage Vo will not decrease sufficiently. Accordingly, as described hereinabove, the conduction time of the second transistor 32 is gradually increased as the low level of the comparison signal Vcomp is maintained.

In the example above, the initial number of high-level pulses is 0, but the number of pulses may be also set to a small number such as 1 and 2. Further, in the example illustrated in FIG. 11, the number of high-level pulses is gradually enlarged in the second half of the second periods T2, but the number of high-level pulses may be also gradually enlarged in the second half.

In this case, when the comparison signal Vcomp assumes a low level, the time of conducting the second transistor 32 in the slot S1 of the initial second period T2 is set to a minimum value, and then the conduction time of the second transistor 32 in the slots S2 to S4 is gradually increased as the low-level of the comparison signal Vcomp is being maintained. As a result, the second transistor 32 is conductive and the electric charge of the capacitor Co can be prevented from being wastefully discarded to the ground GND.

Fifth Embodiment (1)

In the case in which the drive pulses are generated as explained in the third embodiment, the change in which the comparison signal Vcomp is switched from a low level to a high level, maintained at a high level within a plurality of second periods T2, and then switched from the high level to the low level is repeated a plurality of times. In the explanation below, this change is called a periodic change, and the plurality of second periods T2 are called a third period T3.

Figure 12:
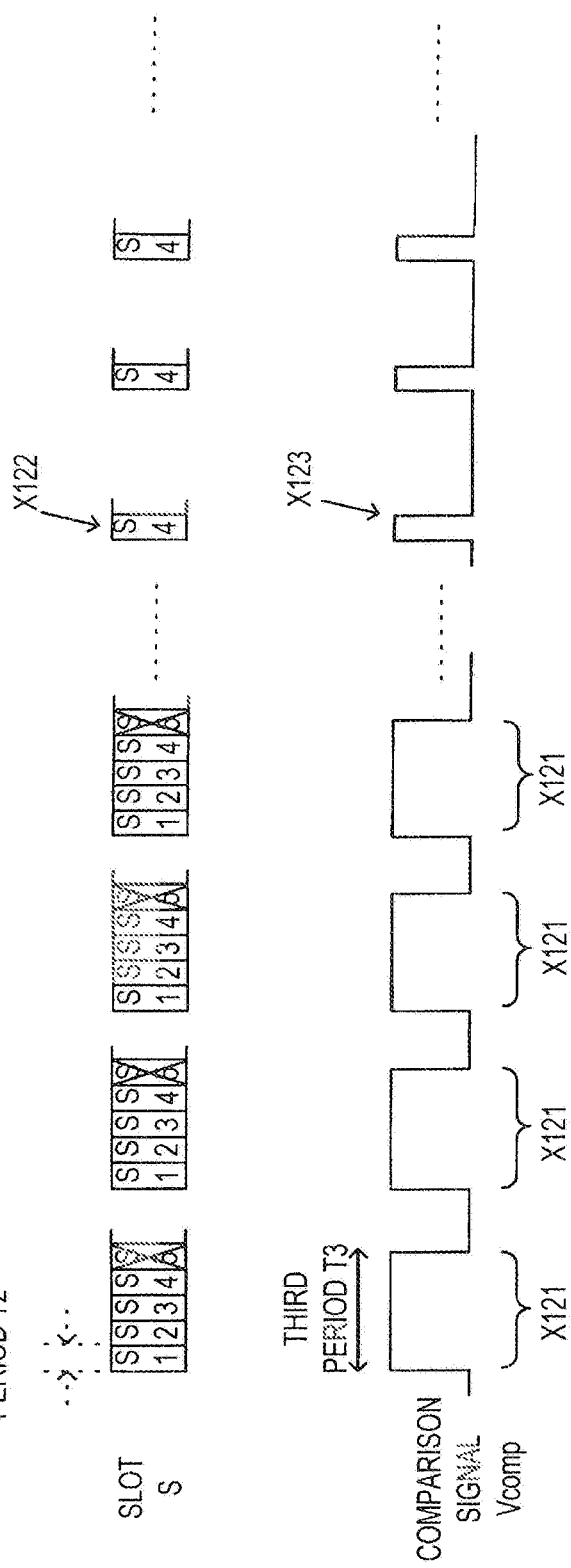
FIG. 12 is a drawing illustrating the periodic repetition of the comparison signal in the fifth embodiment.

FIG. 12 is a diagram illustrating the repetition of such periodic change: slots S and waveforms of comparison signals Vcomp explained in FIG. 8 are illustrated in the order of description from above.

As illustrated in FIG. 7 and FIG. 8, when the first slot counter 74 counts one second period T2 (slot S1), the first drive pulse control circuit 75 controls the number of low-level pulses in the first drive pulses Vp outputted by the first PDM circuit 71 to a first number (indicated by the reference symbol X84 in FIG. 8). Then, when the first slot counter 74 counts 2, 3, and 4 second periods T2 (slots S2 to S4), the first drive pulse control circuit 75 gradually increases the conduction time of the first transistor 31 (see reference symbol X85 in FIG. 8).

Where the first drive pulse control circuit 75 executes such control of the first drive pulse Vp, the comparison signal Vcomp repeats the periodic change, as indicated by the reference symbol X121 illustrated in FIG. 12. In the example illustrated in FIG. 12, the periodic change is repeated four times. The reason for the occurrence of such periodic change is explained below. The conduction time of the first drive pulses Vp corresponding to the initial slot S1 at a timing in which the comparison signal Vcomp assumes a high level is insufficient, and the time required to control the conduction pulse width (conduction time) of the first transistor 31 within the third period T3 to the adequate value is too long. As a result, a certain time is required for the level of the output signal Vo to rise and such a periodic change occurs.

Accordingly, when the comparison signal Vcomp repeats the above-mentioned change a plurality of times as described hereinabove, the first drive pulse control circuit 75 thereafter executes the below-described control. Thus, the first drive pulse control circuit 75 increases the conduction time (referred to hereinbelow simply as "initial time") of the first transistor 31 in the first drive pulses Vp in the initial second period T2 after the comparison signal Vcomp has assumed a low level to a value exceeding the conduction time of the first drive pulses Vp corresponding to the slot S1. The plurality of times is, for example, "4" times.

Explaining the process with reference to the example illustrated in FIG. 12, at the reference symbol X121, the initial time is a low-level time (conduction time of the first transistor 31) in the first drive pulses Vp corresponding to the slot S1 explained in FIG. 8. However, as mentioned hereinabove, even if the low-level time is gradually increased from the initial time, a certain time is required for the level of the output signal Vo to rise. Accordingly, the first drive pulse control circuit 75 sets the initial time to a low-level time in the first drive pulses Vp corresponding to the slot S4 explained in FIG. 8, as indicated by the reference symbol X122, and increases the conduction time of the first transistor 31.

With such control, when the comparison signal Vcomp is switched to a high level, the level of the comparison signal Vcomp promptly rises, and the level of the feedback signal FB becomes higher than the level of the input signal In. As a result, the comparison signal Vcomp is promptly switched from the high level of the low level, as indicated by the reference symbol X123.

In order to perform such control, the first drive pulse control circuit 75 successively holds the maximum value of the count result of the number of second periods T2 outputted from the first slot counter 74 within the interval in which the comparison signal Vcomp maintains a high-level state as the periodic change is repeated. In the example illustrated in FIG. 12, the maximum value of the count result is "4", and the first drive pulse control circuit 75 holds four maximum values "4" of the count result. The number of the count results that have been successively held is for example the above-mentioned plurality of times, and when all of the values of the count results that have been held are, for example, equal to or greater than 4, when the level of the comparison signal Vcomp is switched from the low level to the high level, the first drive pulse control circuit 75 thereafter controls the number of low-level pulses and low-level pulse width in the first drive pulses Vp to the number of low-level pulses and low-level pulse width in the first drive pulses Vp corresponding to the slot S4.

When the level of the comparison signal Vcomp is switched from the high level to the low level in the second period T2 corresponding to the count result of the number of second periods T2 outputted from the first slot counter 74 (the level of the first drive pulse Vp outputted from the first PDM circuit 71 maintains a high-level state), the "count result−1" is considered as the maximum value. In the example illustrated in FIG. 12, since the level of the comparison signal Vcomp is switched from the high level to the low level in the second period T2 corresponding to the count result "5" (slot S5), "5−1"="4" is taken as the maximum value of the count result.

Fifth Embodiment (2)

In the case in which the drive pulses are generated as explained in the fourth embodiment, the change in which the comparison signal Vcomp is switched from a high level to a low level, maintained at the low level within a plurality of second periods T2, and then switched from the low level to the high level is also repeated a plurality of times. In the explanation below, this change is called a periodic change and the plurality of second periods T2 are called a third period T3.

Figure 13:
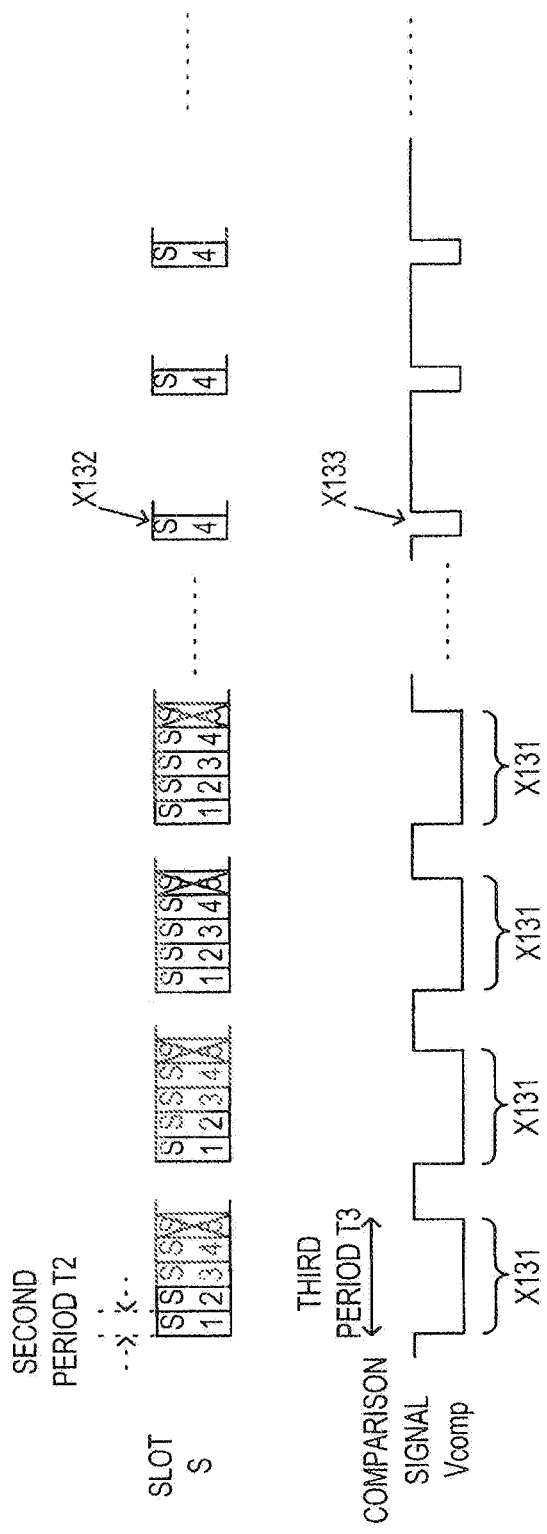
FIG. 13 is another drawing illustrating the periodic repetition of the comparison signal in the fifth embodiment.

FIG. 13 is a diagram illustrating the repetition of such periodic change; slots S and waveforms of comparison signals Vcomp explained in FIG. 10 and FIG. 11 are illustrated in the order of description from above.

As illustrated in FIG. 9, FIG. 10, and FIG. 11, when the second slot counter 94 counts one second period T2 (slot S1), the second drive pulse control circuit 95 controls the number of high-level pulses in the second drive pulses Vn outputted by the second PDM circuit 92 to a second number or a third number (the reference symbol X104 in FIG. 10 or the reference symbol X111 in FIG. 11). Then, when the second slot counter 94 counts 2, 3, and 4 (slots S2 to S4), the second drive pulse control circuit 95 gradually increases the conduction time of the second transistor 32 (see reference symbol X105 in FIG. 10 and the reference symbol X112 in FIG. 11).

Where the second drive pulse control circuit 95 executes such control of the second drive pulse Vn, the comparison signal Vcomp repeats the periodic change, as indicated by the reference symbol X131 illustrated in FIG. 13. In the example illustrated in FIG. 13, the periodic change is repeated four times. The reason for the occurrence of such periodic change is explained below. As described hereinabove, the conduction time of the second drive pulses Vn corresponding to the initial slot S1 at a timing in which the comparison signal Vcomp assumes a low level is insufficient, and the time required to control the conduction pulse width (conduction time) of the second transistor 32 within the third period T3 to the adequate value is too long. As a result, a certain time is required for the level of the output signal Vo to drop and such a periodic change occurs.

Accordingly, when the comparison signal Vcomp repeats the above-mentioned change a plurality of times as described hereinabove, the second drive pulse control circuit 95 thereafter executes the below-described control. Thus, the second drive pulse control circuit 95 increases the conduction time (referred to hereinbelow simply as "initial time") of the second transistor 32 in the second drive pulses Vn in the initial second period T2 after the comparison signal Vcomp has assumed a low level to a value exceeding the conduction time of the second drive pulses Vn corresponding to the slot S1. The plurality of times is, for example, "4".

Explaining the process with reference to the example illustrated in FIG. 13, in the reference symbol X131, the initial time is a high-level time (conduction time of the second transistor 32) in the second drive pulses Vn corresponding to the slot S1 explained in FIG. 10 or FIG. 11. However, as mentioned hereinabove, even if the high-level time is gradually increased from the initial time, a certain time is required for the level of the output signal Vo to drop. Accordingly, the second drive pulse control circuit 95 sets the initial time to a high-level time in the second drive pulses Vn corresponding to the slot S4 explained in FIG. 10 or FIG. 11, as indicated by the reference symbol X132, and increases the conduction time of the second transistor 32.

With such control, when the comparison signal Vcomp is switched to a low level, the level of the output signal Vo promptly drops, and the level of the feedback signal FB becomes lower than the level of the input signal In. As a result, the comparison signal Vcomp is promptly switched from the low level to the high level, as indicated by the reference symbol X133.

In order to perform such control, the second drive pulse control circuit 95 successively holds the maximum value of the count result of the number of second periods T2 outputted from the second slot counter 94 within the interval in which the comparison signal Vcomp maintains a low-level state as the periodic change is repeated. In the example illustrated in FIG. 13, the maximum value of the count result is "4", and the second drive pulse control circuit 95 holds four maximum values "4" of the count result. The number of the count results that have been successively held is for example the above-mentioned plurality of times, and when all of the values of the count results that have been held are, for example, equal to or greater than 4, when the level of the comparison signal Vcomp is switched from the high level to the low level, the second drive pulse control circuit 95 thereafter controls the number of high-level pulses and high-level pulse width in the second drive pulses Vn to the number of high-level pulses and high-level pulse width in the second drive pulses Vn corresponding to the slot S4.

When the level of the comparison signal Vcomp is switched from the low level to the high level in the second period T2 corresponding to the count result of the number of second periods T2 outputted from the second slot counter 94 (the level of the second drive pulse Vn outputted from the second PDM circuit 92 maintains a low-level state), the "count result−1" is considered as the maximum value. In the example illustrated in FIG. 13, since the level of the comparison signal Vcomp is switched from the low level to the high level in the second period T2 corresponding to the count result "5" (slot S5), "5−1"="4" is taken as the maximum value of the count result.

According to the fifth embodiment, when the comparison signal repeats the periodic change, the drive pulse generating unit detects the periodic change and generates the optimum drive pulses. Therefore, it is possible to adapt rapidly to the level change of the comparison signal.

Sixth Embodiment

Figure 14:
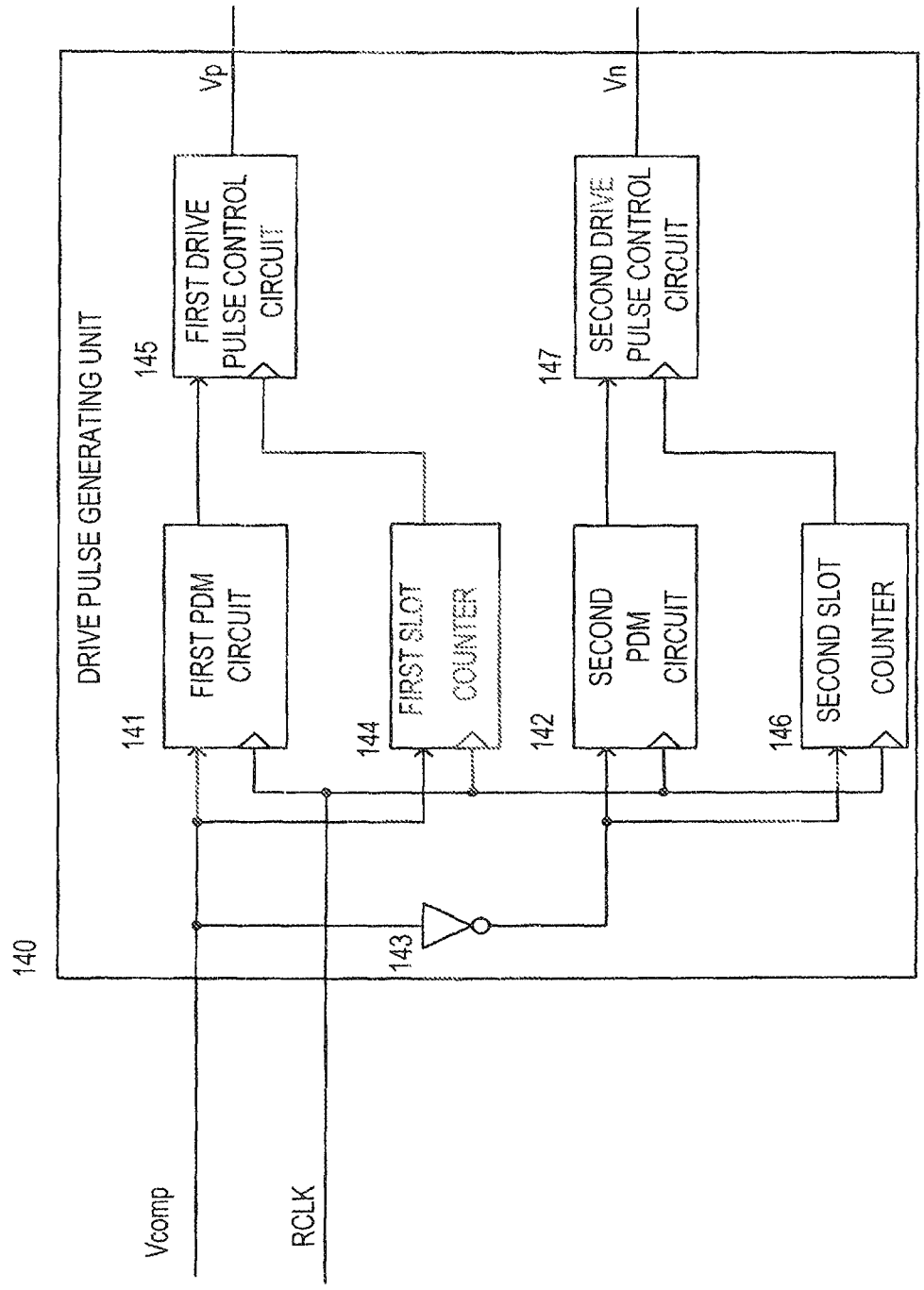
FIG. 14 illustrates a drive pulse generating unit 140 according to the sixth embodiment.

FIG. 14 illustrates a drive pulse generating unit 140 according to the sixth embodiment. The drive pulse generating unit 140 is a drive pulse generating unit obtained by combining the drive pulse generating unit 70 illustrated in FIG. 7 and the drive pulse generating unit 90 illustrated in FIG. 9. The drive pulse generating unit 140 has a first PDM circuit 141, a second PDM circuit 142, an inverter 143, a first slot counter 144, and a first drive pulse control circuit 145. These components function similarly to the first PDM circuit 71, second PDM circuit 72, inverter 73, first slot counter 74, and first drive pulse control circuit 75 illustrated in FIG. 7. The drive pulse generating unit also has a second slot counter 146 and a second drive pulse control circuit 147 which function similarly to the second slot counter 94 and the second drive pulse control circuit 95 illustrated in FIG. 9.

According to the sixth embodiment, the responsiveness of the output signal to a level change of the comparison signal Vcomp can be improved even when the level of the comparison signal Vcomp of the comparison unit 10 is maintained in a high-level or low-level state.

It goes without saying that the output switching circuit explained in the above-described embodiments can be variously modified or changed. For example, a feedback signal FB may be inputted to the non-inverted input terminal of the comparator 11 illustrated in FIG. 3 and the input signal In may be inputted to the inverted input terminal. In this case, the configuration of the output switching circuit explained in the above-described embodiments is changed as necessary. For example, the inverter 53 provided between the comparison unit 10 and the second PDM circuit 52 in the drive pulse generating unit 50 illustrated in FIG. 5 can be moved to a location between the comparison unit 10 and the first PDM circuit 51.

When the output switching circuit explained in the above-described embodiments is used in a device having no LPF, the LPF may be provided in the output switching circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A comparison unit for a switching circuit, comprising:
a comparator configured to compare an input signal with a feedback signal to provide a first signal;
a sampling circuit configured to sample the first signal according to a reference clock to provide a sampling signal, the sampling signal having a first level or a second level; and
a comparison signal generating circuit configured to provide a comparison signal having the first level when the sampling signal is at the first level for a longer time duration than the second level or having the second level when the sampling signal is at the first level for a shorter time duration than the second level.

2. The comparison unit of claim 1, wherein the switching circuit is configured to switch an output signal between the first level and the second level when the comparison signal transitions between the first level and the second level.

3. The comparison unit of claim 2, wherein the switching circuit is configured to switch the output signal synchronously with the reference clock.

4. The comparison unit of claim 1, wherein the switching circuit comprises:
a first transistor configured to provide the output signal at the first level when the comparison signal is at the first level; and
a second transistor, coupled to the first transistor, configured to provide the output signal at the second level when the comparison signal is at the second level.

5. The comparison unit of claim 2, wherein the feedback signal is based upon the output signal.

6. The comparison unit of claim 5, wherein the feedback signal is a representation of the output signal that has been low pass filtered.

7. The comparison unit of claim 1, wherein the first level of the comparison signal indicates that a voltage of the input signal is higher than a voltage of the feedback signal, and
wherein the second level of the comparison signal indicates that the voltage of the input signal is lower than the voltage of the feedback signal.

8. A method for switching a switching circuit, comprising:
comparing an input signal with a feedback signal to provide a first signal;

sampling the first signal according to a reference clock to provide a sampling signal, the sampling signal having a first level or a second level;

providing a comparison signal having the first level when the sampling signal is at the first level for a longer time duration than the second level or having the second level when the sampling signal is at the first level for a shorter time duration than the second level; and switching an output signal of the switching circuit between the first level and the second level when the comparison signal transitions between the first level and the second level.

9. The method of claim 8, wherein the switching comprises:

switching the output signal synchronously with the reference clock.

10. The method of claim 8, wherein the switching comprises:

activating a first transistor to provide the output signal at the first level when the comparison signal is at the first level; and activating a second transistor, coupled to the first transistor, to provide the output signal at the second level when the comparison signal is at the second level.

11. The method of claim 8, wherein the feedback signal is based upon the output signal.

12. The method of claim 8, wherein the feedback signal is a representation of the output signal that has been low pass filtered.

13. The method of claim 8, wherein the first level of the comparison signal indicates that a voltage of the input signal is higher than a voltage of the feedback signal, and wherein the second level of the comparison signal indicates that the voltage of the input signal is lower than the voltage of the feedback signal.

14. A comparison unit for a switching circuit, comprising:

means for comparing an input signal with a feedback signal to provide a first signal;

means for sampling the first signal according to a reference clock to provide a sampling signal, the sampling signal having a first level or a second level; and means for providing a comparison signal having the first level when the sampling signal is at the first level for a longer time duration than the second level or having the second level when the sampling signal is at the first level for a shorter time duration than the second level.

15. The comparison unit of claim 14, wherein the switching circuit is configured to switch an output signal between the first level and the second level when the comparison signal transitions between the first level and the second level.

16. The comparison unit of claim 15, wherein the switching circuit is configured to switch the output signal synchronously with the reference clock.

17. The comparison unit of claim 14, wherein the switching circuit comprises:

a first transistor configured to provide the output signal at the first level when the comparison signal is at the first level; and a second transistor, coupled to the first transistor, configured to provide the output signal at the second level when the comparison signal is at the second level.

18. The comparison unit of claim 15, wherein the feedback signal is based upon the output signal.

19. The comparison unit of claim 18, wherein the feedback signal is a representation of the output signal that has been low pass filtered.

20. The comparison unit of claim 14, wherein the first level of the comparison signal indicates that a voltage of the input signal is higher than a voltage of the feedback signal, and wherein the second level of the comparison signal indicates that the voltage of the input signal is lower than the voltage of the feedback signal.

* * * * *